US008352229B1

(12) United States Patent
Ma et al.

(10) Patent No.: US 8,352,229 B1
(45) Date of Patent: Jan. 8, 2013

(54) RELOADABLE JUST-IN-TIME COMPILATION SIMULATION ENGINE FOR HIGH LEVEL MODELING SYSTEMS

(75) Inventors: Haibing Ma, Superior, CO (US); Chi Bun Chan, San Jose, CA (US); Jingzhao Ou, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 1019 days.

(21) Appl. No.: 12/359,409

(22) Filed: Jan. 26, 2009

(51) Int. Cl.
*G06F 17/50* (2006.01)

(52) U.S. Cl. ......................................................... 703/13

(58) Field of Classification Search ....................... 703/6
See application file for complete search history.

(56) References Cited

U.S. PATENT DOCUMENTS 7,076,596 B1 * 7/2006 Keller et al. ........................ 711/1
7,801,715 B2 * 9/2010 Ciolfi et al. ...................... 703/13

OTHER PUBLICATIONS

Hwang et al.; "System Level Tools for DSP in FPGAs", Field-Programmable Logic and Applications, LNCS 2147, Springer, pp. 534-543, 2001.*
Qin et al.; A Multiprocessing Approach to Accelerate Retargetable and Portable Dynamic-compiled Instruction-set Simulation; CODES+ISSS'06, Oct. 22-25, 2006, Seoul, Korea.; pp. 193-198; 2006.*
Xilinx System Generator v2.1 for Simulink User Guide; 2001; pp. 1-148.*
Simulink Simulation and Model-Based Design, Using Simulink, Version 6; Mathworks; pp. 1-456; 2004.*
Hwang: Design methodologies for signal processing in FPGAs; presented tutorial; The MathWorks, Xilinx Sponsor Signal Processing Conference, 2003; pp. 1-6.*
Altmann et al.; Using ModelSim and Matlab/Simulink for System Simulation in Automotive Engineering; Mentor Graphics Users' Group 2003; pp. 1-35.*
Delva et al.; Using System Generator for Systematic HDL Design, Verification, and Validation; pp. 1-27; Xilinx white paper; Jan. 17, 2008.*
Horgan; MATLAB & Simulink; EDA Weekly; pp. 1-3; Aug. 2004.*
Murthy; Implementation of unmanned vehicle control on FPGA based platform using system generator; MS thesis; Department of Electrical engineering College of Engineering University of South Florida; Jun. 2007; pp. 1-57.*
Boland et al.; Using MATLAB and Simulink in a Systemc Verification Environment; Proc. of Design and Verification Conference & Exhibition, San Jose, Californie, Février 2005; pp. 1-7.*
Xilinx System Generator for DSP Version 9.1.01 User's Guide; Mar. 19, 2007; pp. 1-939; Xilinx.*
Gestner et al., Automatic Generation of ModelSim-Matlab Interface for RTL Debugging and Verification; IEEE, 2007, pp. 1497-1500.*

* cited by examiner

*Primary Examiner* — Hugh Jones
(74) *Attorney, Agent, or Firm* — Kevin T. Cuenot (57) ABSTRACT

A computer-implemented method of creating a simulation engine for simulating a circuit design can include receiving a source code contribution from a high level modeling system and receiving a simulation model specified in an interpretive language that specifies the circuit design. The source code contribution can be compiled together with the simulation model using a Just-In-Time compiler. A simulation engine, specified in native machine code, can be output as a single, integrated software component formed from the source code contribution and the simulation model.

20 Claims, 3 Drawing Sheets

RELOADABLE JUST-IN-TIME COMPILATION SIMULATION ENGINE FOR HIGH LEVEL MODELING SYSTEMS

FIELD OF THE INVENTION

The embodiments disclosed herein relate to simulating circuit designs for implementation within integrated circuit devices (ICs). More particularly, the embodiments relate to a simulation engine that can be used with a high level modeling system to simulate a circuit design for implementation within an IC.

BACKGROUND OF THE INVENTION

A high level modeling system (HLMS) is an electronic design automation tool that allows a designer to create circuits and systems within a graphical design environment. Using a drag-and-drop paradigm, the designer may move graphic blocks, representing circuit components or functions, into the design environment. The designer may "draw" wires connecting the blocks to establish clocking and connectivity, e.g., signal flow, among the blocks.

Typically, an HLMS provides an architecture that allows plug-ins from different manufacturers to be used with the HLMS. Inclusion of these plug-ins allows the functionality of the HLMS to be extended. For example, an HLMS may allow a simulation engine to be used in conjunction with the HLMS. The simulation engine may provide a library of functions necessary to simulate hardware description language code. The simulation engine further may include software-based models of hardware components found within a particular type of programmable integrated circuit (IC) within which the circuit being developed will be implemented. This allows the HLMS to achieve greater accuracy during simulation.

To increase simulation performance, some simulation engines utilize Just-In-Time (JIT) compilation technology. JIT compilation refers to a process where portions of a computer program written in an interpretive language, e.g., a script or bytecode, can be compiled into native machine code for increased execution speed. The compilation typically is performed during execution of the interpretive program. While the runtime performance of the computer program will incur a penalty when portions of the program are compiled, typically this delay is overcome as the resulting native machine code executes much faster than its interpretive counterpart. Moreover, further performance gains are achieved each time the compiled code is executed as JIT compilation need be performed only one time during runtime of the simulation engine.

While using a simulation engine with an HLMS can provide a number of benefits, disadvantages do exist. For example, when a simulation engine runs as a plug-in of an HLMS, the two are still distinct entities. Typically the simulation engine will be implemented as a dynamically linked library (DLL). During runtime while the simulation engine executes, the HLMS and the simulation engine communicate through inter-process communication (IPC) and/or text-based communication. IPC refers to a set of techniques for the exchange of data among multiple threads in one or more processes, e.g., computer programs, executing within a computer. Depending upon the particular IPC technique used and the data exchanged, the latency between threads will vary, but still exists. This latency introduces inefficiencies into the simulation resulting in longer simulation times.

Because of the lack of integration between the simulation engine and the HLMS and the use of JIT compilation within the simulation engine, various internal states of the circuit design being simulated may not be observable during the simulation. The simulation engine must be instructed to write such information to a file. Only after simulation has completed execution may a developer view the contents of the file. This restriction can be inconvenient for the developer.

Another disadvantage of using an HLMS with a pluggable simulation engine is that the simulation engine is restricted to operating as a slave of the HLMS. The master, in this case the HLMS, must initiate all queries to the simulation engine and track the queries, e.g., monitor for responses, and perform the necessary "bookkeeping." This relationship also introduces inefficiencies into the simulation.

SUMMARY OF THE INVENTION

The embodiments disclosed within this specification relate to a simulation engine that can be used with a high level modeling system (HLMS) to simulate a circuit design for implementation within an integrated circuit. One embodiment of the present invention can include a computer-implemented method of creating a simulation engine for simulating a circuit design. The method can include receiving a source code contribution from an HLMS and receiving a simulation model specified in an interpretive language that specifies the circuit design. The source code contribution can be compiled together with the simulation model using a Just-In-Time (JIT) compiler. Responsive to the compiling, a simulation engine can be output in native machine code format as a single, integrated software component formed from the source code contribution and the simulation model.

Compiling can include compiling the source code contribution and the simulation model into a single dynamically loaded library. Compiling further can include generating a plurality of functions that access a block of memory during simulation, wherein the block of memory is consecutively addressable memory that stores state information of the simulation engine. Compiling also can include generating a data type lookup table specifying data types of data items stored in the block of memory and organization of data items stored in the block of memory.

The computer-implemented method can include executing the simulation engine in cooperation with the HLMS to implement a simulation of the circuit design specified by the simulation model, allocating the block of memory for use by the simulation engine, and storing state information for the simulation within the block of memory.

During the simulation, one or more callback functions of the HLMS can be registered with an object of the simulation and an event that triggers the callback function. During the simulation, a data pointer indicating an address within the block of memory can be associated with the object and the event that triggers the callback function.

During the simulation, when the simulation engine is executing, the simulation engine can detect a selected event and invoke a callback function of the HLMS that is registered for the selected event. During the simulation, when the simulation engine is executing, information can be passed between the simulation engine and the HLMS only in the form of pointers and functions in a high level programming language.

In one aspect, contents of the block of memory can be written to a file stored in persistent memory. The file can be reloaded at a later time to recall the state of the simulation. In another aspect, during simulation wherein the simulation engine is executing, the method can include reading data from the block of memory and writing the data read from the block of memory to an integrated circuit that is programmed with at least a portion of the circuit design that is being simulated within the simulation. Subsequently, state information generated by the integrated circuit can be written back to the block of memory and the simulation can be continued.

Another embodiment of the present invention can include a computer-implemented method of creating a simulation engine for simulating a circuit design including compiling a source code contribution from a third party application with a simulation model of the circuit design using just-in-time compilation and generating a simulation engine in native machine code format as a single, integrated software component from the source code contribution and the simulation model. State information for a simulation, when the simulation engine executes, can be stored in a block of memory. A data type lookup table specifying a location of each data item and a data type of each data item within the block of memory can be generated. The simulation engine and the data type lookup table can be output. During simulation, only data pointers and functions of a high level programming language can be passed between the third party application and the simulation engine.

During simulation, when the simulation engine is executing, a callback function of the third party application can be registered with an event that invokes the callback function. During the simulation, responsive to the event being generated, the simulation engine can invoke the callback function of the third party application through which state information from the block of memory is passed using a pointer.

Yet another embodiment of the present invention can include a computer program product including a computer-usable medium having computer-usable program code that, when executed by a data processing system, such as a computer, causes the data processing system to perform the various steps and/or functions disclosed herein.

DETAILED DESCRIPTION

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the invention.

The embodiments disclosed within this specification relate to simulating circuit designs for implementation within integrated circuit devices (ICs). More particularly, the embodiments relate to a simulation engine that can be used with a high level modeling system (HLMS) to simulate a circuit design for implementation within an IC. In accordance with the arrangements disclosed herein, a Just-In-Time (JIT) compiler can be used to generate a simulation engine. The JIT compiler can combine, e.g., compile, a simulation model corresponding to the circuit design to be simulated together with a source code contribution from the HLMS. The compilation can generate a unified, simulation engine.

The JIT compiler can conform to an application programming interface (API) and provide the necessary functions within the resulting simulation engine to implement the API. The source code contribution from the HLMS also can conform with the API. This allows the source code contribution to be seamlessly integrated with the simulation model into a unified, simulation engine.

The resulting simulation engine provides a variety of benefits over conventional techniques for using a simulation engine as a plug-in of an HLMS. For example, by combining source code from the HLMS with the simulation engine, the amount of inter-process communication that must be performed can be significantly reduced as the portion of the HLMS that closely interacts with the simulation engine can be provided in the source code contribution and integrated into the simulation engine. The state of the simulation engine, and thus a simulation, can be preserved, read, and written during simulation in a number of ways that will be described in greater detail within this specification. This allows circuit designers to check state information for the circuit design during execution of the simulation engine. Further benefits and advantages will be provided in the specification to follow in conjunction with the accompanying figures.

The embodiments described within this specification can be implemented in the form of a data processing system, e.g., a computer, executing computer-usable program code. A "computer" suitable for storing and/or executing program code will include at least one processor coupled directly or indirectly to physical memory elements through a system bus. The memory elements can include local memory employed during actual execution of the program code, e.g., random access memory, bulk storage, and cache memories which provide temporary storage of at least some program code in order to reduce the number of times code must be retrieved from bulk storage during execution.

Input/output (I/O) devices such as, for example, keyboards, displays, pointing devices, etc., can be coupled to the computer either directly or through intervening I/O controllers. Network adapters may also be coupled to the computer to enable the computer to become coupled to other computers, devices, or remote printers or storage devices through intervening private or public networks. Modems, cable modems, and Ethernet cards are just a few of the currently available types of network adapters.

Figure 1:
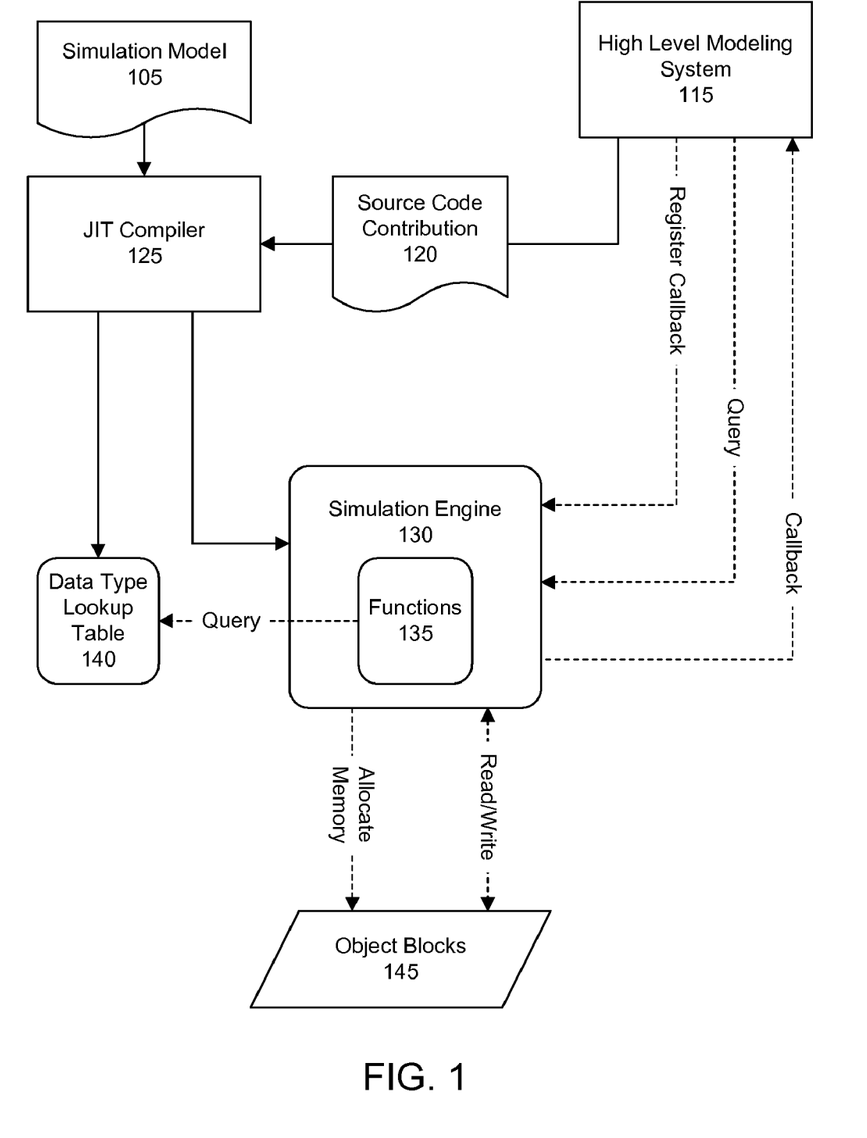
FIG. 1 is a block diagram illustrating a technique for creating a simulation engine in accordance with one embodiment of the present invention.

FIG. 1 is a block diagram illustrating a technique for creating a simulation engine in accordance with one embodiment of the present invention. FIG. 1 illustrates various steps and processes can be performed at "compile time" and at "runtime." As used within this specification, the phrase "compile time" refers to the process of generating a simulation engine. As such, compile time occurs prior to, and is a necessary prerequisite to, simulating a circuit design. The phrase "runtime," as used within this specification, refers to the point in time when a simulation engine has been created via compilation and is executing, thereby creating or implementing a simulation session with regard to a particular circuit design within a computer.

As shown, the system can include a JIT compiler 125 and an HLMS 115. JIT compiler 125 can receive a simulation model 105 and a source code contribution 120 from HLMS 115. In general, JIT compiler 125 compiles both simulation model 105 and source code contribution 120 to generate and output simulation engine 130. As used herein, "outputting" and/or "output" can mean, for example, writing to a file, storing in memory, writing to a user display or other output device, playing audible notifications, sending or transmitting to another system, exporting, or the like.

Simulation model 105 can be a programmatic description of the circuit design or system that is to be simulated. Generally, simulation model 105 is a programmatic description of the behavior of the circuit design and need not be, for example, a final implementation of the circuit design. For instance, simulation model 105 can be specified in an interpretive programming language. As such, simulation model 105 must be parsed and interpreted to be executed as compared to computer-usable program code that exists as native machine code that can be directly executed by a computer. In another example, simulation model 105 can be specified in a hardware description language (HDL) such as Verilog or VHDL. In another example, simulation model 105 can be specified using bytecode or a scripting language that must be interpreted such as mCode. mCode is used within Matlab, which is a product that is commercially available from The Mathworks, Inc. of Natick, Mass.

The circuit design specified by simulation model 105 which is to be simulated can be one that is to be implemented within an IC. The type of IC within which the circuit design is to be implemented can vary. For example, the circuit design can be implemented as a custom IC, e.g., an application specific integrated circuit (ASIC), a mixed signal IC, or a programmable IC.

Programmable ICs are a type of IC that can be programmed to perform specified logic functions. One type of programmable IC, the field programmable gate array (FPGA), typically includes an array of programmable tiles. These programmable tiles can include, for example, I/O blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Other types of programmable ICs can include the complex programmable logic device (CPLD), programmable logic arrays (PLAs), and programmable array logic (PAL) devices. For all of these programmable ICs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other programmable ICs are programmed by applying a processing layer, such as a metal layer, that programmably interconnects the various elements on the device. These programmable ICs are known as mask programmable devices. Programmable ICs can also be implemented in other ways, e.g., using fuse or antifuse technology. The phrase "programmable IC" can include, but is not limited to, these devices and further may encompass devices that are only partially programmable. For example, one type of programmable IC includes a combination of hard-coded transistor logic and a programmable switch fabric that programmably interconnects the hard-coded transistor logic.

HLMS 115 can provide a graphic design environment for creating or specifying circuit designs. HLMS 115 can provide source code, referred to as source code contribution 120, which can be combined, through compilation, with simulation model 105 to form simulation engine 130. Within FIG. 1, compile time actions are indicated with solid lines. Actions that occur during simulation, e.g., at runtime of simulation engine 130, are illustrated with dashed lines.

Conventionally, a JIT compiler is used to compile selected portions of a simulation model at runtime, e.g., during the simulation, to improve runtime performance of the simulation model. The portions of the simulation model that are compiled, e.g., converted into machine code, execute faster than the interpretive code that was compiled. Within the embodiment illustrated in FIG. 1, a JIT compiler 125 can receive simulation model 105 as input along with source code contribution 120. JIT compiler 125 can compile both simulation model 105 and source code contribution 120 to generate and output simulation engine 130.

In general, source code contribution 120 can be specified, or written to, conform to a known API that is supported, or implemented, by both JIT compiler 125 and the resulting simulation engine 130. By conforming to the API, which will be described within this specification in greater detail, source code contribution 120 can be seamlessly integrated with simulation model 105 resulting in the single, integrated simulation engine 130. In one embodiment, JIT compiler 125 can generate simulation engine 130 as a single, dynamically linked library (DLL) file, or the like. Accordingly, simulation engine 130 will include computer-usable program code contributed from simulation model 105 as well as computer-usable program code specified as source code, e.g., source code contribution 120, from HLMS 115.

In illustration, consider the case where HLMS 115 provides a waveform viewer that is more desirable in one or more respects than the waveform viewer typically used by a simulation engine. In that case, source code contribution 120 from HLMS 115 can specify various functions that allow simulation engine 130 to interact with that waveform viewer within HLMS 115. For example, source code contribution 120 may specify functions that initialize the waveform viewer. As long as source code contribution 120 conforms to the specified API, JIT compiler 125 can compile source code contribution 120 with simulation model 105, in combination, to produce the single, integrated simulation engine 130.

The resulting simulation engine 130 provides several advantages over conventional methods of incorporating a simulation engine with an HLMS, e.g., as a plug-in. For instance, allowing HLMS 115 to inject source code into simulation engine 130 results in less inter-process communication, e.g., less cross-DLL communication, during simulation. Computer-usable program code that manipulates or responds to the simulation from HLMS 115 can be provided as source code contribution 120 and directly integrated into simulation engine 130. This avoids unnecessary communication between HLMS 115 and simulation engine 130 and increases the efficiency of communication and the speed of the simulation.

This close integration of the source code directly involved with simulation engine 130 also allows JIT compiler 125 to optimize both simulation model 105 and source code contribution 120 together, potentially resulting in faster execution speed and/or a smaller memory footprint in simulation engine 130. Once the simulation model 105 and source code contribution 120 are combined, the JIT compiler 125 can perform one or more global optimizations as more information is then known about the combined execution flow between simulation model 105 and source code contribution 120. For example, JIT compiler 125 can perform improved register allocation, dead code removal, constant propagation, pointer aliasing analysis, or the like.

Another advantage is that simulation engine 130 can be implemented as a standalone application. This means that HLMS 115 need not provide JIT functionality. For example, source code contribution 120 may be the master of the execution flow and utilize the API to interact with the simulation objects specified by the simulation model 105. In that case, combining source code contribution 120 and simulation engine 130 can produce a composite, standalone computer program.

JIT compiler 125 can generate simulation engine 130 and a data type lookup table 140. Simulation engine 130 can include a plurality of functions 135. When simulation engine 130 executes, e.g., during a simulation, simulation engine 130 can allocate memory to create one or more object blocks 145. As the simulation progresses, simulation engine 130 can read information from, and write information to, different ones of object blocks 145. Each object block can represent a circuit component. Any state information for the simulation can be stored in object blocks 145 in physical memory of the computer. In one embodiment, each object block can be a block of raw memory, e.g., a block of contiguous memory addresses. As shown, during simulation, object blocks 145 can be accessed solely through simulation engine 130, e.g., using functions 135 with reference to data type lookup table 140.

Functions 135 can include functions for reading object blocks 145, writing data to object blocks 145, as well as one or more callback registering functions. In general, the callback registering functions allow simulation engine 130 to notify HLMS 115 of the occurrence of particular events that occur during the course of a simulation. Within conventional systems, HLMS 115 must continually poll simulation engine 130 to determine whether an event has occurred. This continual polling requires computing resources and introduces overhead into the simulation process each time HLMS 115 polls simulation engine 130. The overhead introduced by polling is often exacerbated as such polling is conducted using inter-process communication. By registering callback functions of HLMS 115 and providing notifications to HLMS 115, simulation runtime efficiency is increased through the reduction or elimination of polling of simulation engine 130 by HLMS 115 and through the reduction in inter-process communication previously described.

Data type lookup table 140 can store descriptions of all objects and sub-objects used by simulation engine 130 during simulation, which will be stored as object blocks 145. For example, data type lookup table 140 can specify the size of an object, the number of bits the object represents, and the memory offset of each object relative to the beginning address of the top level object. In general, the term "object," as used within this specification, refers to a programmatic representation of a component of a circuit design being simulated. The phrase "object block," in general, refers to the portion of memory within which state information for a particular object is stored.

The term "object" and the phrase "object block" may be used interchangeably from time-to-time within this specification as one refers to the representation of a circuit component and the other refers to the memory reflecting the state of that component in the simulation. Most user-accessible entities of a simulation are referred to as "objects." For example, an object can provide an object interface (a set of API methods) through which user-specified code can interact with the underlying activity encapsulated by the object. Further examples of objects can include, for instance, a circuit design, a port, a signal, or a simulation event.

To ensure that simulation engine 130 is pluggable into any of a variety of different third party systems, functions 135 must operate on a predetermined set of data types defined by the API. In one embodiment, simulation engine 130 can operate on basic data types of a high level programming language such as C. Such basic data types can include, but are not limited to, "int," "float," "double," "char," and standard pointers. Standard pointers can include "void *," "int *," "float *," "double *," and "char *." In such an embodiment, only pointers and functions can be permitted to pass between simulation engine 130 and HLMS 115. For example, objects can be passed between simulation engine 130 and HLMS 115 as void pointers in C. A void pointer refers to a pointer used to work with raw memory, e.g., object blocks 145. That is, JIT compiler 125 is unaware of the type of memory or data structure that is being passed. Using a void pointer allows a pointer for an unspecified type of memory to be passed between simulation engine 130 and HLMS 115.

Data type lookup table 140 can include a complete description of each of object blocks 145. Due to the use of void pointers, data type lookup table 140 can map pointers to specific ones of the object blocks 145 and to the type description of each respective one of the object blocks 145. As such, the various functions 135 used to access object blocks 145 during a simulation can utilize information in data type lookup table 140 to determine the type of information being accessed, the location of such information, as well as the size of the information.

At runtime, simulation engine 130 allocates a block of memory, e.g., a block of contiguous addresses within which the object blocks 145 will be stored. When an object, e.g., a circuit component, is created by simulation engine 130 via an initialize function, that object is formed of a block of consecutive raw words as an object block 145 within the allocated block of memory. The object is passed to the HLMS 115 as a void pointer in C. HLMS 115 can maintain the object pointer and any related function pointers for the object. The void pointer that is passed to the HLMS 115 can point to a block of raw data, defined as an array of words in C. JIT compiler 125 can maintain a record of how the raw data is organized, e.g., data type lookup table 140, and generated code, e.g., function 135, to operate upon the raw data stored with object blocks 145.

Each sub-object, such as a port object or a local variable of a larger circuit component object, also can be implemented as a raw pointer. This allows the JIT-compiled simulation engine 130 to function efficiently and preserves the ability to be debugged. Lookup table 140 can be utilized primarily for interactions between HLMS 115 and simulation engine 130. During a simulation, simulation engine 130 can execute different ones of functions 135, as may be required and as generated by JIT compiler 125. The functions 135 can include offsets to different objects of the simulation model 105 within the block of raw data. The offsets for the functions 135 can be calculated by the JIT compiler 125 during compilation. The means that accessing an object or variable of simulation model 105 becomes a memory read operation rather than a case of executing a sequence of different linked or intertwined functions.

As noted, data type lookup table 140 maps the raw object pointers to the type description of each respective object of object blocks 145 and includes a complete description of each object maintained within object blocks 145 used by simulation engine 130 during runtime. Object blocks 145 maintain complete state information of simulation engine 130 and the simulation at any given time. Accordingly, the simulation state, inclusive of the state of simulation engine 130, can be saved for later use by writing the content of object blocks 145 to a file in persistent memory, e.g., writing the file to a hard drive. The state of the simulation then can be reloaded by reading the content of the file and writing that data to an allocated block of memory to effectively re-instantiate each object block to resume a previously halted or paused simulation.

At runtime, e.g., during simulation, HLMS 115 can register callback functions with simulation engine 130 via one or more callback registration functions specified within the API and included in functions 135. HLMS 115 may also query simulation engine 130 using any of the functions available within the API to be described. Responsive to detecting various events, simulation engine 130 may also invoke different callback functions of HLMS 115 that have been associated with, via the callback registration function(s), the detected events.

It should be appreciated that while an HLMS is used within FIG. 1, the embodiments are not so limited. The embodiments described within this specification can be used with any of a variety of third party applications that may be used in conjunction with a simulation engine. Such third party applications may be configured to contribute source code to be compiled together with a simulation model by a JIT compiler to produce a simulation engine as described.

The API utilized by the JIT compiler, to which the source code contribution and the HLMS described with reference to FIG. 1 must conform, defines a variety of different functions and allowable, e.g., supported, data types. The tables that follow describe available functions of the API. Prior to describing the functions, it is useful to consider the data types supported by the API.

The supported data types can include scalar data types and composite data types. A scalar data type can be either a fixed point number or a floating point number. A fixed point number will have a plurality of static properties indicating information such as whether the fixed point number is signed, unsigned, or Boolean, the number of bits occupied by the fixed point number, and the binary point position of the fixed point number. The actual data portion of the fixed point scalar can include a validity indicator, an integral portion, and a fractional portion. A floating point scalar can include static properties such as exponent width and fractional width. The actual data portion of the floating point scalar can include a sign indicator specifying positive or negative, an exponent portion, and a fractional portion.

A composite data type can be a struct or an array. A struct refers to a fixed collection of name value pairs. The collection is static during runtime of the simulation engine. A value within the name value pairs of the struct can itself be a scalar type or a composite type. An array can be implemented as a one-dimensional array, with each element being of the same type. While the number of elements of the array need not be fixed during runtime of the simulation engine, the length of each respective element of the array is.

The tables that follow illustrate various functions of the API for the different data types described. These functions will, for example, access the data type lookup table to obtain any needed information describing the particular data to be accessed, e.g., whether read from an object block or written to an object block. Table 1 lists the different functions of the API that are available for all data types.

TABLE 1

| Function | Description |
| --- | --- |
| Object_sizeof | Takes an object pointer as the argument and returns an integer number. This function returns the size of that value in terms of the number of bytes. |
| Object_gettype | Takes the object pointer as the argument and returns a string for its data type name. |

Table 2 lists functions of the API that are available for the fixed point number data type.

TABLE 2

| Function | Description |
| --- | --- |
| Fixed_number_getArith | Takes an object as the argument and returns a string for the arithmetic type. |
| Fixed_number_GetWidth | Takes an object pointer as the argument and returns an integer number as the width. |
| Fixed_number_GetBinpt | Takes an object pointer as the argument and returns an integer number as the binary point position. |
| Fixed_number_toDouble | Takes an object pointer as the argument and returns a double precision number. |
| Fixed_number_isValid | Takes an object pointer as the argument and returns true or false to indicate whether a fixed point number is valid or not. |
| Fixed_number_fromDouble | Takes an object pointer and a double precision number as the arguments and converts the double precision number to the fixed pointer number. The function saves the fixed pointer to the pointer to which the fixed pointer points. |
| Fixed_number_toString | Takes an object pointer as the argument and returns a string representation of the fixed point number. |
| Fixed_number_copyValue | Takes two object pointers and copies one fixed point number to the other fixed point number. |

Table 3 lists functions of the API that are available for the floating point number data type.

TABLE 3

| Function | Description |
| --- | --- |
| Float_number_getExponentWidth | Takes an object pointer as the argument and returns an integer number for the exponent bit width. |
| Float_number_getFractionWidth | Takes an object pointer as the argument and returns an integer number for the fractional bit width. |
| Float_number_toDouble | Takes an object pointer as the argument and returns a double precision number. |

TABLE 3-continued

| Function | Description |
| --- | --- |
| Float_number_fromDouble | Takes an object pointer and a double precision number as the arguments, converts the double precision number to the floating point number with corresponding exponent width and fractional width, and saves the fixed pointer to the pointer to which the fixed pointer points. |
| Float_number_toString | Takes an object pointer as the argument and returns a string representation of the floating point number. |
| Float_number_copyValue | Takes two object pointers and copies one floating point number to the other. |

Table 4 lists functions of the API that are available for the struct data type.

TABLE 4

| Function | Description |
| --- | --- |
| Struct_getFieldNames | Takes an object pointer and returns an array of strings for the list of field names. |
| Struct_getFieldIndex | Takes an object pointer and a string as the field name and returns an integer number to indicate the index for the field. |
| Struct_getFieldObject | Takes an object pointer and a string as the field name and returns an object pointer as the value for the field. |

Table 5 lists functions of the API that are available for the array data type.

TABLE 5

| Function | Description |
| --- | --- |
| Array_getLength | Takes an object pointer and returns an integer number as the number of elements in the array. |
| Array_getElement | Takes an object pointer and an integer number as the arguments and returns an object pointer. |

Figure 2:
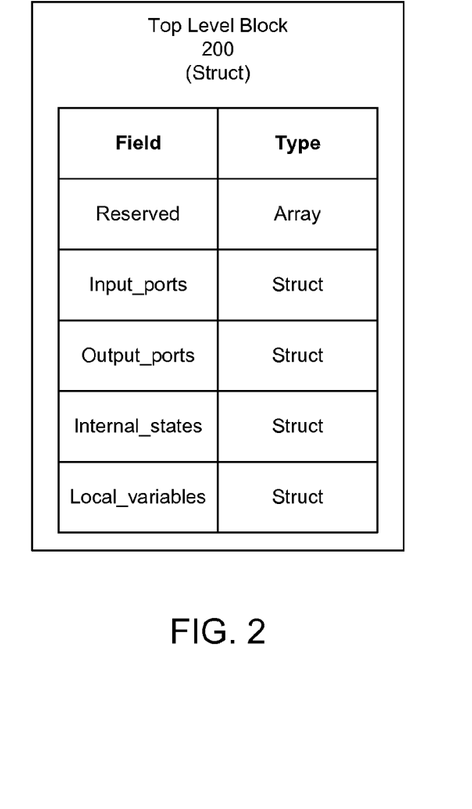
FIG. 2 is a pictorial illustration of a layout of an object block in accordance with another embodiment of the present invention.

FIG. 2 is a pictorial illustration of the layout of an object block in accordance with another embodiment of the present invention. In general, the data layout of any given object block will include one or more input ports, one or more output ports, internal states, and local variables. The data layout can include a top level block 200 having a type of struct. Top level block object 200 can include a plurality of fields shown as "Reserved," "Input_ports," "Output_ports," "Internal_states," and "Local_variables." The Reserved field can be set to the data type of array and include a plurality of raw pointers. In general, the Reserved field can store information relating to setup and environment of the simulation engine. For example, information such as the JIT compiler version number, the addresses of message buffers, and the addresses of standard I/O buffers can be stored within the reserved field.

The Input_ports field can be a struct. The Output_ports field can be a struct. The Internal_states field and the Local_variables field also may be structs. In general, for any given struct, the fields of that struct can be specified in order. The data type lookup table will specify the offset of the starting address of each field of the struct, the size of each field, and the access function for the data type corresponding to that field.

As described, various events can be defined within the simulation engine. The occurrence or detection of an event can be associated with a particular callback function of the HLMS. The callback function of the HLMS may be registered with the simulation engine during execution, e.g., at runtime. Table 6 is a list of the different types of events that can be generated within the simulation engine during runtime along with a description of each respective event. When each event is generated, the simulation engine can implement a callback to the particular callback function of the HLMS that has been registered, or associated, with the generated event.

TABLE 6

| Event Type | Event Description |
| --- | --- |
| INIT | An event that occurs when an object, such as a block object, is constructed. |
| GET | An event that occurs when a read operation is performed on an object. For example, a GET event is generated when a read is performed on a local variable. |
| PUT | An event that occurs when a write operation is performed on an object. |
| PRE_GET | An event that occurs when a read operation is about to be performed on an object. |
| PRE_PUT | An event that occurs when a write operation is about to be performed on an object. |
| CHANGE | An event that occurs when a write operation is performed on an object and the write operation changes the value of the object. |
| PRE_CHANGE | An event that occurs when a write operation is about to be performed on an object and the write operation will change the value of the object. |

The different events with the prefix "pre" can be utilized in conjunction with callback functions in situations where, for example, user code alters a state of an object of the simulation model prior to a read or a write operation is performed upon the simulation object. In illustration, user code can force a value on a particular port. That code can be invoked responsive to a "pre" type of event. Once the GET event is generated, the value forced onto the port, rather than the original value of the port, can be retrieved. This is particularly useful for debugging and verification where the user code can change an object state on-the-fly to alter the simulation flow as well as intentionally injecting errors.

The callback functions of the HLMS that are invoked responsive to the detection or generation of an event within the simulation engine can have a defined function signature. In general, a function signature refers to a variety of attributes that describe a function such as the name of the function, the number, order, and types of parameters of the function, as well as any qualifiers that can be applied to the function. The signature of a callback function of the HLMS can conform to the following syntax: void function_name(void *object, char *event_name, void *data). The first argument, referred to as object, can be the pointer to the object block to which the callback function is related. The object to which the pointer points can be a port object, a state object, or a local variable object of a circuit component object. The second argument, referred to as event_name, specifies the particular event that is generated or detected within the simulation engine that will invoke the callback function named function_name. The event_name argument allows the user to create a single callback function that serves several different purposes. A different portion of the function can be invoked, for example, based upon the particular event name that is specified. The third argument, denoted as data, can be a pointer to a block of arbitrary data that is associated with the callback function for an object.

The simulation engine can provide registering function(s) that can be used to associate such a data pointer with the corresponding callback function. If, for example, the data registering function is not invoked, the data pointer will be null. In one embodiment, the simulation engine can provide two registering functions. A first registering function can be used to associate a callback function with an object and an event. A second registering function can be used to associate a data pointer with an object and an event.

The first registering function can be the register_callback function. The register_callback function can associate a callback function of the HLMS with an object and an event. The register_callback function can have the following function signature: void register_callback(char *object_path, char *event_name, void *callback_function). The first argument, denoted as object_path, can be the hierarchical path of an object. For example a hierarchical path of an input port labeled "din" can be "inport/din". The second argument, denoted as event_name, can specify an event from Table 6. The third argument, denoted as callback_function, can be a pointer to the callback function being registered with the specified object and event.

The second registering function can be the store_callback_data function. The store_callback_data function can associate a data pointer with an object and an event. The store_callback_data function can have the following function signature: void store_callback_data(char *object_path, char *event_name, void *data). The first argument, denoted as object_path, again can refer to the hierarchical path of an object. The second argument, denoted as event_name, can specify a particular event as specified within Table 6. The third argument, denoted as data, can be a pointer specifying the address of the callback function.

Figure 3:
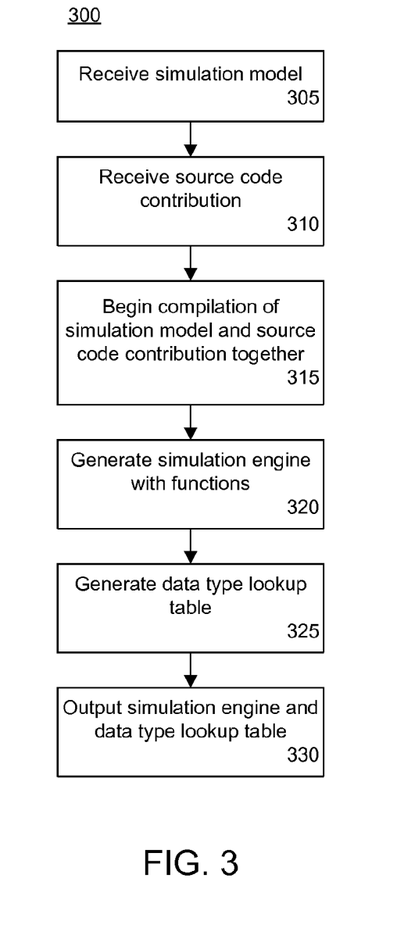
FIG. 3 is a flow chart illustrating a method of creating a simulation engine in accordance with another embodiment of the present invention.

FIG. 3 is a flow chart illustrating a method 300 of creating a simulation engine in accordance with another embodiment of the present invention. Method 300 can be implemented using a data processing system to implement the various functions described with reference to FIGS. 1-2. Method 300 can begin in a state where a circuit designer has specified or created a simulation model. As noted, the simulation model can be specified in an interpretive programming language. The circuit designer further may wish to use one or more software components of a third party system, such as an HLMS, along with a particular simulation engine. Method 300 can be performed by a circuit designer using a JIT compiler as described within this specification.

In step 305, the JIT compiler can receive the simulation model specifying the behavior of a circuit design that is to be simulated. In step 310, the JIT compiler can receive a source code contribution from the third party system. As noted, the source code contribution can specify a particular software component that the circuit designer wishes to incorporate into his or her simulation. In step 315, the JIT compiler can begin compilation of the simulation model and the source code contribution together. The JIT compiler can begin integrating the source code contribution with the simulation model into a simulation engine that is specified in native machine code.

As part of the compilation process, in step 320, the JIT compiler can generate a plurality of functions. The functions effectively implement an API that may be accessed by the third party software during execution of the simulation engine being generated. The functions can include one or more callback registration functions that allow the simulation engine to provide data back to the third party application responsive to an event in lieu of being continuously polled by the third party application.

In step 325, the JIT compiler can generate the data type lookup table. In step 330, the JIT compiler can output the simulation engine and the data type lookup table.

Figure 4:
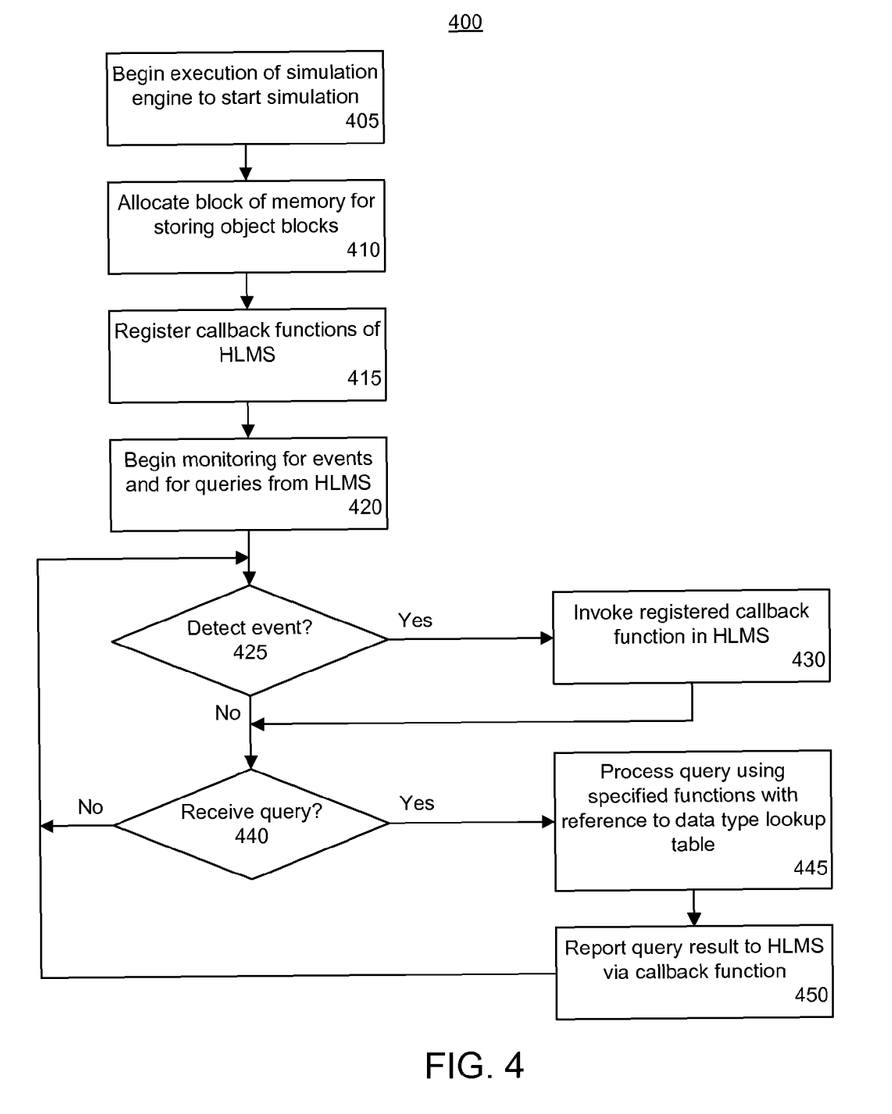
FIG. 4 is a flow chart illustrating a method of simulating a circuit design in accordance with another embodiment of the present invention.

FIG. 4 is a flow chart illustrating a method 400 of simulating a circuit design in accordance with another embodiment of the present invention. Method 400 can be implemented using data processing system executing a simulation engine generated as described with reference to FIGS. 1-3. Method 400 can begin in a state where the simulation engine has been generated along with the data type lookup table. The simulation engine can be used in cooperation with a third party application program such as an HLMS.

In step 405, the simulation engine can be executed. Execution of the simulation engine can signify the start of a simulation of a circuit design. As noted, execution of the simulation engine is considered "runtime." In step 410, the simulation engine can allocate a block of memory for storing object blocks. As noted, the organization of the object blocks can be specified by the data type lookup table. The entire state of the simulation can be stored as raw data within the object blocks.

In step 415, the HLMS can invoke one or more of the callback registration functions of the simulation engine to register callback functions. In step 420, the simulation engine can begin monitoring for events and for queries from the HLMS. In step 425, the simulation engine can determine whether an event has been detected. If so, the method can proceed to step 430. If not, the method can continue to step 440. In step 430, when an event has been detected, the simulation engine can invoke the callback function of the third party application that has been registered with the simulation engine in association with the detected event. After step 430, the method can continue to step 440.

In step 440, the simulation engine can determine whether a query has been received from the HLMS. If so, the method can proceed to step 445. If not, the method can loop back to step 425 to continue monitoring for events and queries. It should be appreciated that although not shown, additional logic may be included to exit, e.g., terminate the simulation, responsive to particular user input or the occurrence of designated criteria.

Proceeding with step 445, where a query has been received, the query can be processed using specified functions with reference to the data type lookup table. That is, the query, according to the API, can invoke one or more functions available within the simulation engine. In step 450, the query results can be reported back to the HLMS through a callback function. As illustrated in Table 6, a variety of different events may be defined relating to the reading of data from an object block and/or the writing of data to an object block. As such, when an action is performed as specified by a query, an event can be generated. The callback function associated with the generated and/or detected event can be invoked as part of the mechanism for the simulation engine to report query results back to the third party application. After step 450, the method can loop back to step 425 to continue processing as described.

In accordance with another embodiment of the present invention, the simulation architecture described can accommodate the inclusion, or use, of a physical implementation of a circuit design. As noted, the simulation may be paused, with the entire state of the simulation being stored within the object blocks. When paused, state information for the simulated circuit design, or a portion thereof, may be written to a hardware implementation of the circuit, e.g., to an IC on a test platform used for hardware co-simulation. The hardware implementation may be permitted to execute for a number of clock cycles, e.g., under the control of the HLMS. At some point, the state of the hardware implementation of the circuit design may be read back from the physical IC disposed on the test platform and stored in the appropriate object blocks.

Once the state information of the simulation is updated, as read back from the physical IC, the simulation can proceed. In this manner, the simulation engine can be used to perform hardware co-simulation.

The embodiments described within this specification provide a simulation engine and techniques for performing simulation that provide increased integration and efficiency between the simulation engine and third party applications. By incorporating source code from the third party application directly within the simulation engine and utilizing a defined API, inter-process communication can be reduced. Further, the simulation can be debugged, stopped, and subsequently restarted as raw data is stored in the object blocks and pointers and functions are passed between the simulation engine and the third party application during the simulation.

The flowcharts in the figures illustrate the architecture, functionality, and operation of possible implementations of systems, methods, and computer program products according to various embodiments of the present invention. In this regard, each block in the flowcharts may represent a module, segment, or portion of code, which comprises one or more portions of computer-usable program code that implements the specified logical function(s).

It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustrations, and combinations of blocks in the flowchart illustrations, can be implemented by special purpose hardware-based systems that perform the specified functions or acts, or combinations of special purpose hardware and computer instructions.

Embodiments of the present invention can be realized in hardware, software, or a combination of hardware and software. The embodiments can be realized in a centralized fashion in one data processing system or in a distributed fashion where different elements are spread across several interconnected data processing systems. Any kind of data processing system or other apparatus adapted for carrying out the methods described herein is suited. A typical combination of hardware and software can be a general-purpose computer system with a computer program that, when being loaded and executed, controls the computer system such that it carries out the methods described herein.

Embodiments of the present invention further can be embedded in a computer program product, which comprises all the features enabling the implementation of the methods described herein. The computer program product can include a computer-usable or computer-readable medium having computer-usable program code which, when loaded in a computer system, causes the computer system to perform the functions described herein. Examples of computer-usable or computer-readable media can include, but are not limited to, optical media, magnetic media, magneto-optical media, computer memory, or the like.

The terms "computer program," "software," "application," "computer-usable program code," variants and/or combinations thereof, in the present context, mean any expression, in any language, code or notation, of a set of instructions intended to cause a system having an information processing capability to perform a particular function either directly or after either or both of the following: a) conversion to another language, code or notation; b) reproduction in a different material form. For example, a computer program can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, although not necessarily directly, and not necessarily mechanically, e.g., communicatively linked through a communication channel or pathway or another component or system.

The embodiments disclosed herein can be embodied in other forms without departing from the spirit or essential attributes thereof. Accordingly, reference should be made to the following claims, rather than to the foregoing specification, as indicating the scope of the various embodiments of the present invention.

What is claimed is:

1. A computer-implemented method of creating a simulation engine for simulating a circuit design, the method comprising:
   receiving a source code contribution from a high level modeling system;
   receiving a simulation model specified in an interpretive language that specifies the circuit design;
   compiling the source code contribution together with the simulation model using a Just-In-Time compiler; and
   responsive to the compiling, outputting a simulation engine in native machine code format as a single, integrated software component formed from the source code contribution and the simulation model.

2. The computer-implemented method of claim 1, wherein compiling further comprises compiling the source code contribution and the simulation model into a single dynamically linked library.

3. The computer-implemented method of claim 1, wherein during a simulation wherein the simulation engine is executing, the simulation engine:
   detects a selected event; and
   invokes a callback function of the high level modeling system that is registered for the selected event.

4. The computer-implemented method of claim 1, wherein compiling further comprises generating a plurality of functions that access a block of memory during simulation, wherein the block of memory is consecutively addressable memory that stores state information of the simulation engine and is referenced using void pointers.

5. The computer-implemented method of claim 4, wherein during simulation wherein the simulation engine is executing, the method further comprises:
   reading data from the block of memory;
   writing the data read from the block of memory to an integrated circuit that is programmed with at least a portion of the circuit design that is being simulated within the simulation; and
   subsequently writing state information generated by the integrated circuit back to the block of memory and continuing the simulation.

6. The computer-implemented method of claim 4, wherein compiling further comprises generating a data type lookup table specifying data types of data items stored in the block of memory and organization of data items stored in the block of memory;
   wherein the data type lookup table is independent of the block of memory used during simulation; and wherein the source code contribution specifies functions configured to interact with the high level modeling system.

7. The computer-implemented method of claim 6, wherein during a simulation wherein the simulation engine is executing, information is passed between the simulation engine and the high level modeling system only in the form of void pointers and functions in a high level programming language; and wherein data types for data referenced by the void pointers are determined by the simulation engine using the data type lookup table.

8. The computer-implemented method of claim 1, further comprising:

executing the simulation engine in cooperation with the high level modeling system to implement a simulation of the circuit design specified by the simulation model;

allocating the block of memory for use by the simulation engine; and storing state information for the simulation within the block of memory.

9. The computer-implemented method of claim 8, further comprising writing contents of the block of memory to a file stored in persistent memory, wherein the file is reloaded at a later time to recall the state of the simulation.

10. The computer-implemented method of claim 8, further comprising, during the simulation, registering at least one callback function of the high level modeling system with an object of the simulation and an event that triggers the callback function.

11. The computer-implemented method of claim 10, further comprising, during the simulation, associating a data pointer indicating an address within the block of memory with the object and the event that triggers the callback function.

12. A computer-implemented method of creating a simulation engine for simulating a circuit design, the method comprising:

compiling a source code contribution from a third party application with a simulation model of the circuit design using just-in-time compilation;

generating a simulation engine in native machine code format as a single, integrated software component from the source code contribution and the simulation model, wherein state information for a simulation when the simulation engine executes is stored in a block of memory;

generating a data type lookup table specifying a location of each data item and a data type of each data item within the block of memory; and outputting the simulation engine and the data type lookup table, wherein during simulation, only data pointers comprising void pointers and functions of a high level programming language are passed between the third party application and the simulation engine;

wherein data types for data referenced by the void pointers are determined by the simulation engine from the data type lookup table.

13. The computer-implemented method of claim 12, further comprising, during a simulation wherein the simulation engine is executing, registering a callback function of the third party application with an event that invokes the callback function.

14. The computer-implemented method of claim 13, wherein during the simulation, responsive to the event being generated, the simulation engine invokes the callback function of the third party application through which state information from the block of memory is passed using a pointer.

15. A computer program product comprising:

a non-transitory computer-usable medium storing computer-usable program code that creates a simulation engine for simulating a circuit design, the computer-usable medium comprising:

computer-usable program code that receives a source code contribution from a high level modeling system;

computer-usable program code that receives a simulation model specified in an interpretive language that specifies the circuit design;

computer-usable program code that just-in-time compiles the source code contribution together with the simulation model; and computer-usable program code that, responsive to the compiling, outputs a simulation engine in native machine code format as a single, integrated software component formed from the source code contribution and the simulation model.

16. The computer program product of claim 15, wherein the computer-usable medium comprises:

computer usable program code that executes the simulation engine in cooperation with the high level modeling system to implement a simulation of the circuit design specified by the simulation model;

computer usable program code that allocates the block of memory for use by the simulation engine; and computer usable program code that stores state information for the simulation within the block of memory.

17. The computer program product of claim 16, wherein the computer-usable medium further comprises computer-usable program code that writes contents of the block of memory to a file stored in persistent memory, wherein the file is reloaded at a later time to recall the state of the simulation.

18. The computer program product of claim 16, wherein the computer-usable medium further comprises computer-usable program code that, during a simulation wherein the simulation engine is executing, passes information between the simulation engine and the high level modeling system only in the form of void pointers and functions in a specified high level programming language;

wherein data types for data referenced by the void pointers are determined from the data type lookup table by the simulation engine; and wherein the source code contribution specifies functions configured to interact with the high level modeling system.

19. The computer program product of claim 16, wherein the computer-usable medium further comprises computer-usable program code that, during the simulation, registers at least one callback function of the high level modeling system with an object and an event that triggers the callback function.

20. The computer program product of claim 19, wherein the computer-usable medium further comprises computer-usable program code that, during the simulation, associates a data pointer indicating an address within the block of memory with the object and the event that triggers the callback function.

* * * * *